US008579393B2

(12) United States Patent  
Song et al.

(10) Patent No.: US 8,579,393 B2
(45) Date of Patent: Nov. 12, 2013

(54) SERVER HAVING RETRACTABLE FOOT PAD

(75) Inventors: Zheng-Bing Song, Shenzhen (CN); Zhi-Xin Li, Shenzhen (CN); Jun-Xiong Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 230 days.

(21) Appl. No.: 13/204,723

(22) Filed: Aug. 8, 2011

(65) Prior Publication Data

US 2012/0169191 A1   Jul. 5, 2012

(30) Foreign Application Priority Data

Dec. 29, 2010 (CN) .................. 2010 1 0 6124226

(51) Int. Cl.
*A47B 91/00* (2006.01)
(52) U.S. Cl.
USPC ................ 312/351.9; 312/223.1; 361/725; 248/188.8
(58) Field of Classification Search
USPC ........ 312/223.1–223.2, 351.6, 351.9; 211/26; 361/679.32–679.39, 679.59, 679.01, 361/679.02, 752, 724–727, 683, 685; 248/188.1, 188.6, 188.8, 188.2, 677, 248/346.11
See application file for complete search history.

(56) References Cited

U.S. PATENT DOCUMENTS

| 4,516,508 | A | * | 5/1985 | Kako et al. ................... 108/7 |
| 5,111,361 | A | * | 5/1992 | Kobayashi ............. 361/679.44 |
| 5,297,003 | A | * | 3/1994 | Nomura et al. ......... 361/679.12 |
| 6,311,941 | B1 | * | 11/2001 | Feldmeyer ................ 248/188.8 |
| 6,682,240 | B1 | * | 1/2004 | Chou ............................ 400/691 |
| 7,106,596 | B1 | * | 9/2006 | Reznikov ...................... 361/724 |
| 2003/0076018 | A1 | * | 4/2003 | Helot et al. ................ 312/223.2 |
| 2003/0081376 | A1 | * | 5/2003 | Helot et al. ................... 361/683 |
| 2005/0057896 | A1 | * | 3/2005 | Homer .......................... 361/686 |
| 2005/0254875 | A1 | * | 11/2005 | Hui-hu ......................... 400/472 |
| 2005/0285486 | A1 | * | 12/2005 | Xu .............................. 312/223.2 |
| 2009/0266947 | A1 | * | 10/2009 | Tang .......................... 248/188.8 |
| 2009/0268396 | A1 | * | 10/2009 | Tang ......................... 361/679.55 |
| 2009/0316353 | A1 | * | 12/2009 | Tang ......................... 361/679.55 |
| 2010/0149752 | A1 | * | 6/2010 | Lian ......................... 361/679.59 |
| 2011/0007466 | A1 | * | 1/2011 | Wang ........................ 361/679.2 |
| 2011/0221315 | A1 | * | 9/2011 | Chen ......................... 312/223.2 |
| 2012/0133261 | A1 | * | 5/2012 | Yuan et al. ................ 312/334.1 |
| 2012/0160646 | A1 | * | 6/2012 | Zhang et al. ................. 200/336 |
| 2013/0009526 | A1 | * | 1/2013 | Lu ............................. 312/223.1 |
| 2013/0037546 | A1 | * | 2/2013 | Shih ............................. 220/476 |

* cited by examiner

*Primary Examiner* — Darnell Jayne
*Assistant Examiner* — Ryan A Doyle
(74) *Attorney, Agent, or Firm* — Altis & Wispro Law Group, Inc.

(57) ABSTRACT

An exemplary server includes a housing having a lateral side defining four openings, and a foot pad fixed in each of the openings. The foot pad includes a pivoting rod and a supporting member pivotally connected to the pivoting rod. The supporting member is operable to rotate in the opening, thereby the supporting member being totally received in the opening, or a part of the supporting member protruding outwardly from the opening for supporting the housing.

18 Claims, 5 Drawing Sheets

SERVER HAVING RETRACTABLE FOOT PAD

BACKGROUND

1. Technical Field

The disclosure relates to servers, and particularly to a server with foot pads.

2. Description of Related Art

With increasing heavy use of on-line computer applications, the need for computer data centers has increased rapidly. Container data centers are centralized computing facilities that include many servers, often arranged on server racks or shelves. Typically, the servers are stacked within each server rack. When each server is removed from the server rack to be placed on the floor/ground, four foot pads are mounted on a bottom of the server for preventing the server from directly contacting the floor/ground. The foot pads are secured on the bottom of the server by a plurality of screws. When the server is reinstalled into the server rack, the foot pads need to be detached from the server—otherwise the foot pads would interfere with the server rack. It is inconvenient to mount and detach the foot pads onto and from the servers.

What is needed, therefore, is a server which can overcome the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
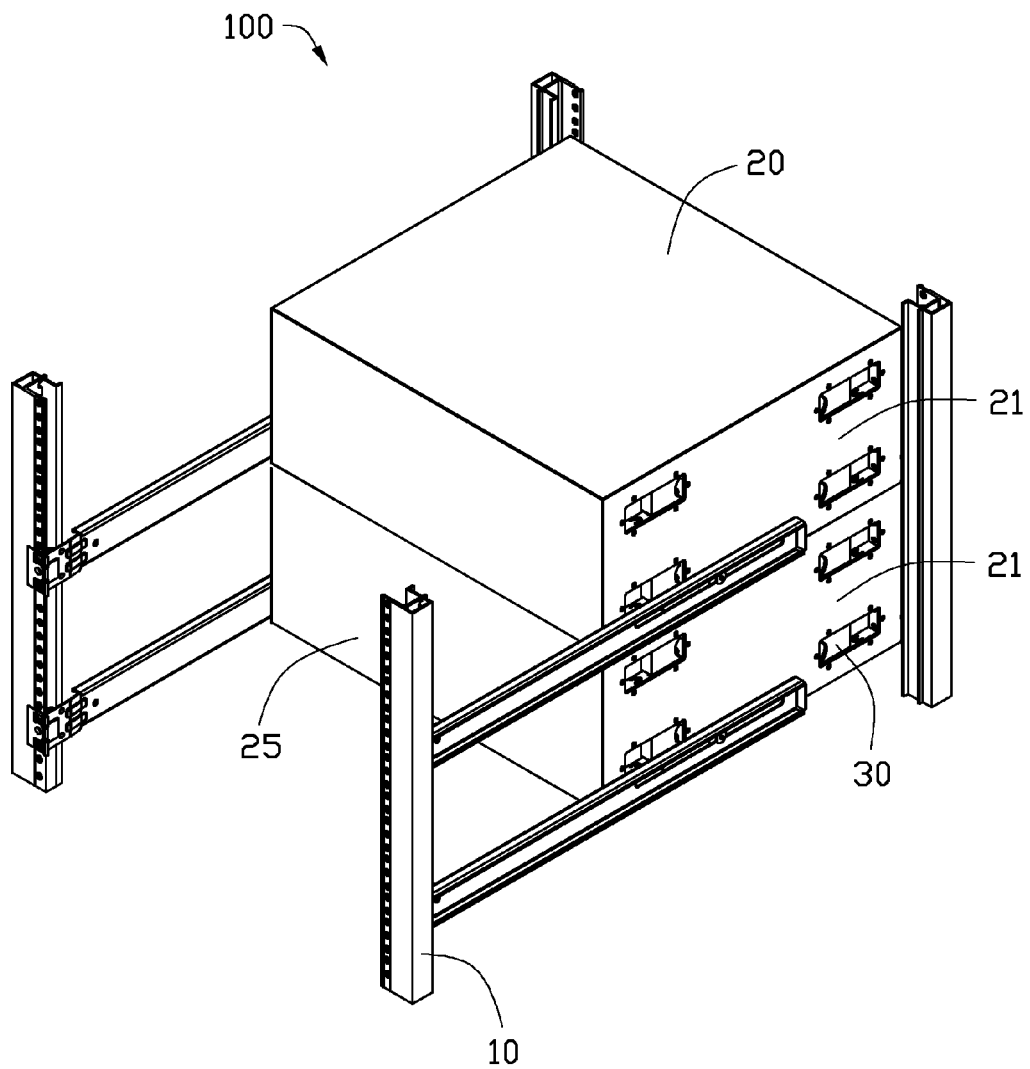
FIG. 1 is an isometric, assembled view of part of a container data center comprising a plurality of servers in accordance with an exemplary embodiment.

Referring to FIG. 1, part of a container data center 100 comprising a plurality of servers 20 in accordance with an exemplary embodiment of the disclosure is shown. The container data center 100 further comprises a hollow cuboid rack 10. The servers 20 are stacked on the rack 10.

Figure 2:
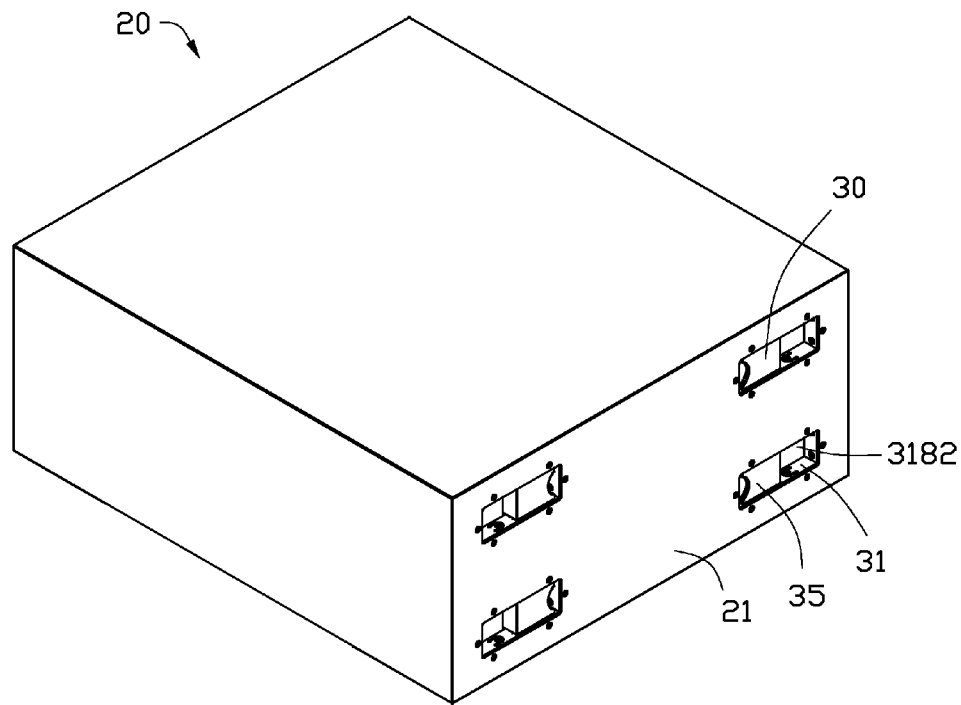
FIG. 2 is an isometric, enlarged view of one server of FIG. 1, wherein the server has four foot pads mounted thereon and arranged in a first state.
Figure 3:
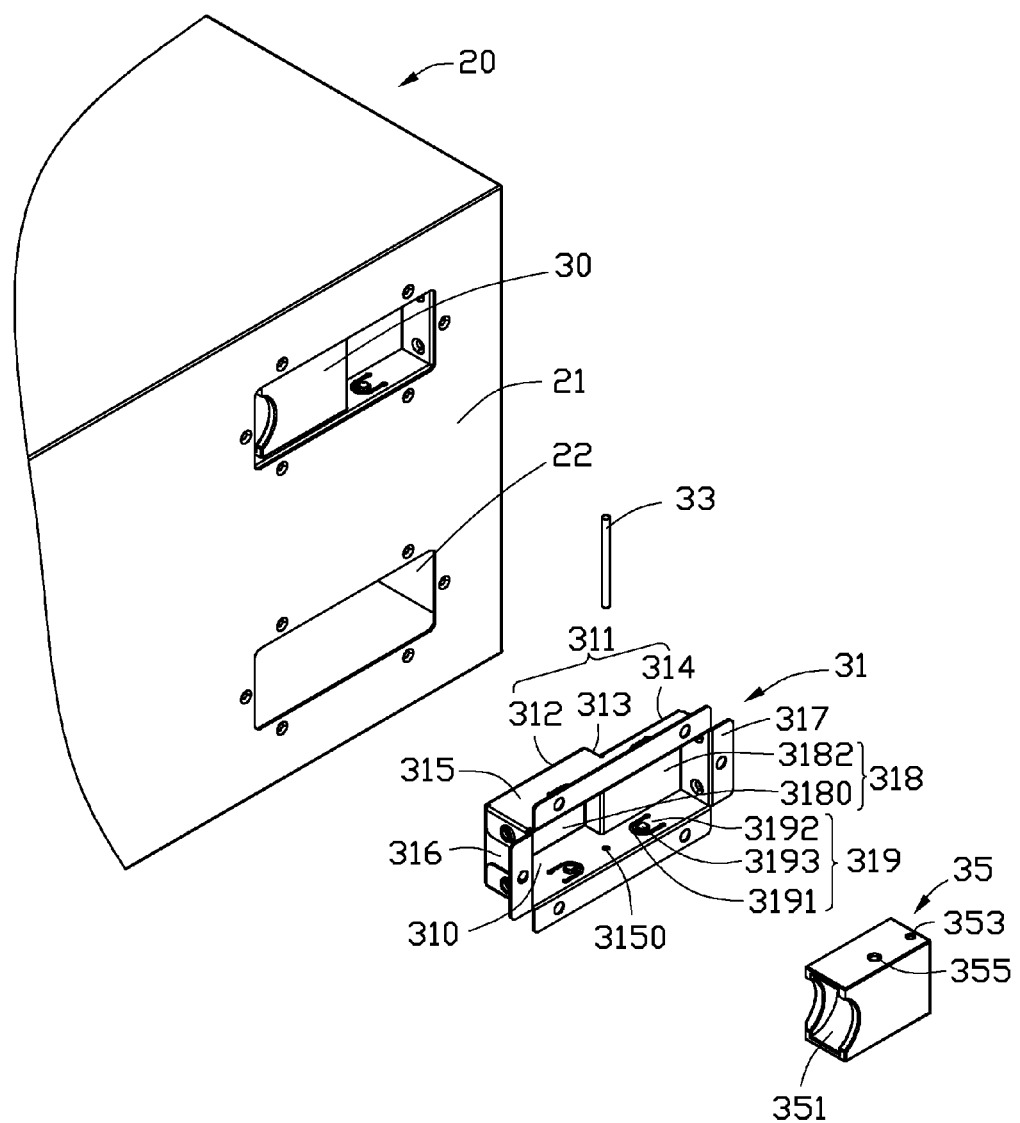
FIG. 3 is an enlarged view of part of the server of FIG. 2, wherein one of the foot pads is exploded.

Each of the servers 20 comprises a housing 25 and a plurality of foot pads 30 mounted on a lateral side 21 of the housing 25. When the server 20 is disassembled from the rack 10 to be arranged on the floor/ground, the lateral side 21 is taken as a bottom of the server 20. Referring to FIGS. 2-3 also, the lateral side 21 of the housing 25 defines a plurality of rectangular openings 22 therein. The openings 22 correspondingly accommodate the foot pads 30 therein. Each of the foot pads 30 comprises a fixing member 31, a pivoting rod 33, and a supporting member 35 pivotally connected to the pivoting rod 33.

The fixing member 31 of each foot pad 30 is a box. The fixing member 31 comprises an open side 310 facing a corresponding opening 22, a bottom wall 311 opposite to the open side 310, two first sidewalls 315 extending from two elongated edges of the bottom wall 311 to the open side 310, and two second sidewalls 316 extending from another two edges of the bottom wall 311 to the open side 310. The bottom wall 311 cooperates with the first sidewalls 315 and the second sidewalls 316 to define a receiving space 318. Four flanges 317 respectively extend outwardly from top ends of the first and second sidewalls 315, 316. The flanges 317 are coplanar with the open side 310. In assembly, the flanges 317 are fixed to an inner face of the lateral side 21 of the housing 25.

The bottom wall 311 of the fixing member 31 has a stepped configuration, and comprises a first part 312, a second part 314, and a connecting part 313 connecting the first part 312 and the second part 314. The first part 312 is parallel to the second part 314. The connecting part 313 is substantially perpendicular to the first part 312 and the second part 314. A length of the first part 312 is substantially equal to that of the second part 314. The second part 314 is nearer to the flanges 317 than the first part 312; that is, a distance between the second part 314 and the flanges 317 is smaller than that between the first part 312 and the flanges 317. The receiving space 318 consists of a first portion 3180 defined corresponding to the first part 312, and a second portion 3182 defined corresponding to the second part 314, whereby a depth of the first portion 3180 is larger than that of the second portion 3182. A pivoting hole 3150 is defined in each of the first sidewalls 315. The two pivoting holes 3150 are located adjacent to the connecting part 313 of the bottom wall 311 and face each other. Two opposite ends of the pivoting rod 33 are pivotally received in the two pivoting holes 3150, respectively.

A pair of holding portions 319 are formed in each of the first sidewalls 315. The pair of holding portions 319 are symmetrical relative to the pivoting rod 33. Each holding portion 319 comprises a U-shaped through slot 3191 defined in a corresponding first sidewall 315, an elastic section 3192 surrounded by the through slot 3191, and a protrusion 3193 protruding from the elastic section 3192 toward an inside of the receiving space 318.

The supporting member 35 is a substantially rectangular block. A through hole 353 is defined at an end of the supporting member 35. The pivoting rod 33 is received in the through hole 353, and the supporting member 35 is capable of rotating relative to the pivoting rod 33. A curved opening 351 is defined at an opposite end of the supporting member 35, for facilitating a user to operate the supporting member 35. Two recesses 355 are respectively defined in top and bottom faces of the supporting member 35. A distance between each recess 355 and the pivoting rod 33 is equal to that between the protrusion 3193 of a corresponding holding portion 319 and the pivoting hole 3150, for the protrusion 3193 to be engagingly received in the recess 355.

Figure 4:
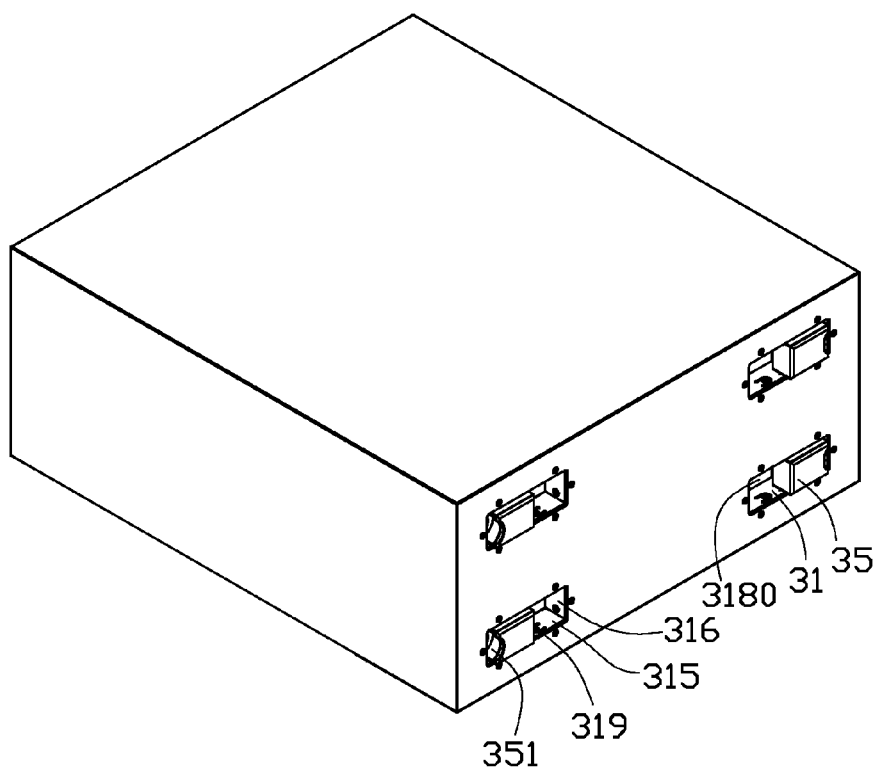
FIG. 4 is similar to FIG. 2, but showing the foot pads of the server rotated to be arranged in a second state.
Figure 5:
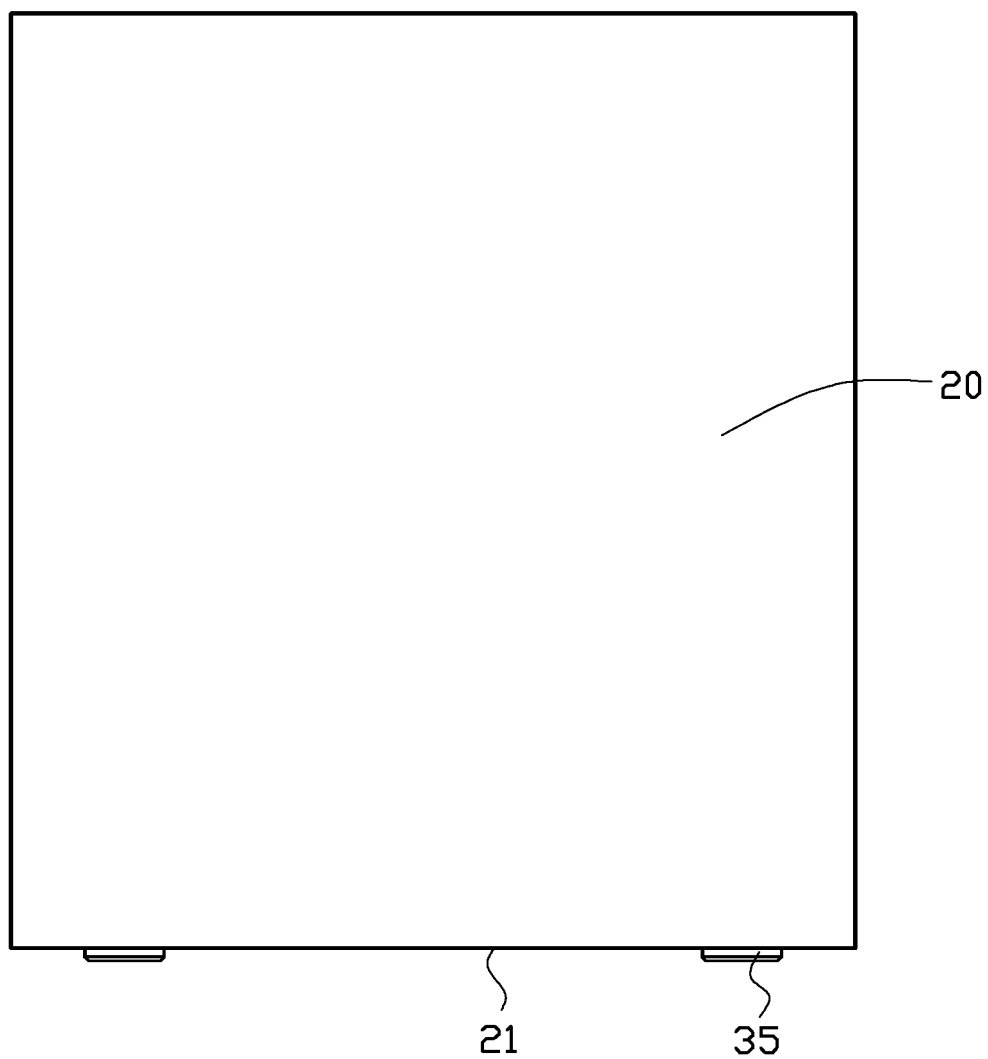
FIG. 5 is a plan view of the server of FIG. 4, showing the server standing on its side ready to be placed on the floor/ground.

In use, referring to FIGS. 2 and 3 again, the foot pads 30 of the server 20 are held in a first state, and the supporting members 35 of the foot pads 30 are totally received in the first portions 3180 of the fixing member 31, respectively. When the server 20 is to be placed on the floor/ground, the supporting members 35 are correspondingly rotated relative to the pivoting rods 33 one by one, until the supporting members 35 are correspondingly received in the second portions 3182 of the fixing members 31, and the recesses 355 snappingly receive the protrusions 3193 of corresponding holding portions 319 again, as shown in FIGS. 4-5. Thereby, the foot pads 30 are held in a second state. Because the depth of the first portion 3180 is larger than that of the second portion 3182 of the receiving space 318 of each fixing member 31, the corresponding supporting member 35 is partially received in the second portion 3182. That is, at least a part of the supporting member 35 protrudes outwardly from the second portion 3182 of the fixing member 31 and a corresponding opening 22 of the housing 25, and acts as a supporting structure. The four supporting structures contact the floor/ground to prevent the housing 25 of the server 20 from directly contacting the floor/ground.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server comprising:
a housing comprising a lateral side defining a plurality of openings; and
a plurality of foot pads mounted on the lateral side of the housing and respectively received in the openings, each foot pad comprising a fixing member, a pivoting rod fixed in the fixing member, and a supporting member pivotally connected to the pivot, the supporting member being totally received in the fixing member, and being operable to rotate about the pivoting rod to a position in which at least a part of the supporting member protrudes outwardly from the lateral side of the housing;
wherein each fixing member defines a space accommodating the supporting member therein, the space consists of a first portion and a second portion, and the supporting member is operable to be totally received in the first portion or partially received in the second portion; and
wherein the supporting member of each foot pad received in the first portion of the space is rotated 180 degrees relative to the supporting member received in the second portion of the space.

2. The server of claim 1, wherein each fixing member is a box and comprises an open side facing a corresponding opening, a bottom wall opposite to the open side, and a plurality of side walls connecting the open side and the bottom wall.

3. The server of claim 2, wherein the bottom wall comprises a first part, a second part, and a connecting part connecting the first part and the second part, and a distance between the first part and the open side is larger than that between the second part and the open side.

4. The server of claim 3, wherein the first portion of the space is defined corresponding to the first part of the bottom wall, and the second portion of the space is defined corresponding to the second part of the bottom wall.

5. The server of claim 3, wherein the pivoting rod is sandwiched between two opposite side walls and located adjacent to the connecting part.

6. The server of claim 3, wherein the first part of the bottom wall is parallel to the second part, and perpendicular to the connecting part.

7. The server of claim 2, wherein a plurality of holding portions are respectively formed in the side walls, each holding portion comprises a U-shaped through slot, an elastic section surrounded by the through slot, and a protrusion protruding outwardly from the elastic section.

8. The server of claim 2, wherein the open side of the fixing member is fixed on an inner face of the lateral side of the housing.

9. The server of claim 1, wherein a through hole is defined in an end of the supporting member for receiving the pivoting rod therein, and a curved opening is defined in an opposite end of the supporting member.

10. A server comprising:
a housing having a lateral side defining at least an opening; and
a foot pad pivotably fixed in the opening, the foot pad comprising a pivoting rod and a supporting member pivotally connected to the pivoting rod, the supporting member being operable to rotate in the opening between a position in which the supporting member is totally received in the opening and a position in which at least a part of the supporting member protrudes outwardly from the lateral side of the housing for supporting the housing;
wherein the foot pad further comprises a fixing member received in the opening, the fixing member defines a space accommodating the supporting member therein, the space consists of a first portion and second portion, and the supporting member is operable to be totally received in the first portion or partially received in the second portion; and
wherein the supporting member of the foot pad received in the first portion of the space is rotated 180 degrees relative to the supporting member received in the second portion of the space.

11. The server of claim 10, wherein each fixing member is a box and comprises an open side facing a corresponding opening, a bottom wall opposite to the open side, and a plurality of side walls connecting the open side and the bottom wall.

12. The server of claim 11, wherein the bottom wall comprises a first part, a second part, and a connecting part connecting the first part and the second part, and a distance between the first part and the open side is larger than that between the second part and the open side.

13. The server of claim 12, wherein the first portion of the space is defined corresponding to the first part of the bottom wall, and the second portion of the space is defined corresponding to the second part of the bottom wall.

14. The server of claim 12, wherein the pivoting rod is sandwiched between two opposite side walls and located adjacent to the connecting part.

15. The server of claim 12, wherein the first part of the bottom wall is parallel to the second part, and perpendicular to the connecting part.

16. The server of claim 11, wherein a plurality of holding portions are respectively formed in the side walls, each holding portion comprises a U-shaped through slot, an elastic section surrounded by the through slot, and a protrusion protruding outwardly from the elastic section.

17. The server of claim 11, wherein the open side of the fixing member is fixed on an inner face of the lateral side of the housing.

18. The server of claim 10, wherein a through hole is defined in an end of the supporting member for receiving the pivoting rod therein, and a curved opening is defined in an opposite end of the supporting member.

* * * * *